US012658930B2

(12) United States Patent
Srivastava et al.

(10) Patent No.: US 12,658,930 B2
(45) Date of Patent: Jun. 16, 2026

(54) PHASE-LOCKED LOOP (PLL) CIRCUITRY HAVING PHASE INTERPOLATORS WITH REDUCED POWER CONSUMPTION

(71) Applicant: Apple Inc., Cupertino, CA (US)

(72) Inventors: Ankit Srivastava, San Diego, CA (US); Ahmed I Hussein, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/882,316

(22) Filed: Sep. 11, 2024

(65) Prior Publication Data

US 2026/0074703 A1 Mar. 12, 2026

(51) Int. Cl.
| | |
|---|---|
| H03L 7/197 | (2006.01) |
| H03K 5/134 | (2014.01) |
| H03L 7/093 | (2006.01) |
| H03L 7/099 | (2006.01) |
| H03K 5/00 | (2006.01) |

(52) U.S. Cl.
CPC ........... H03L 7/1976 (2013.01); H03K 5/134 (2014.07); H03L 7/093 (2013.01); H03L 7/099 (2013.01); *H03K 2005/00052* (2013.01)

(58) Field of Classification Search
CPC ....... H03L 7/1976; H03L 7/093; H03L 7/099; H03K 5/134; H03K 2005/00052
See application file for complete search history.

(56) References Cited

U.S. PATENT DOCUMENTS

| | | | |
|---|---|---|---|
| 7,417,510 B2 | 8/2008 | Huang | |
| 8,058,914 B2 | 11/2011 | Kristensson et al. | |
| 8,373,472 B2 * | 2/2013 | Thaller | H03L 7/183 |
| | | | 327/158 |
| 10,594,329 B1 * | 3/2020 | Elkholy | H03L 7/081 |
| 11,418,199 B1 * | 8/2022 | Cherniak | H03L 7/087 |
| 11,909,406 B1 * | 2/2024 | Hussein | H03L 7/093 |

OTHER PUBLICATIONS

Madoglio Paolo et al., "A Cellular Multiband DTC-Based Digital Polar Transmitter With -153-dBc/Hz Noise in 14-nm FinFET", IEEE Journal of Solid-State Circuits, Jul. 2020, pp. 1830-1841, vol. 55 No. 7, IEEE.

* cited by examiner

*Primary Examiner* — Sibin Chen
(74) *Attorney, Agent, or Firm* — Treyz Law Group; Jason Tsai

(57) ABSTRACT

Phase-locked loop circuitry is provided that includes a time-to-digital converter, a first frequency divider circuit coupled to an output of the time-to-digital converter, and a second frequency divider circuit coupled between the first frequency divider circuit and an input of the time-to-digital converter and having a phase interpolator with a plurality of delay circuits forming a first digital-to-analog converter (DAC) circuit and a second digital-to-analog converter (DAC) circuit separate from the first DAC circuit. The phase interpolator can be calibrated using the time-to-digital converter.

20 Claims, 7 Drawing Sheets

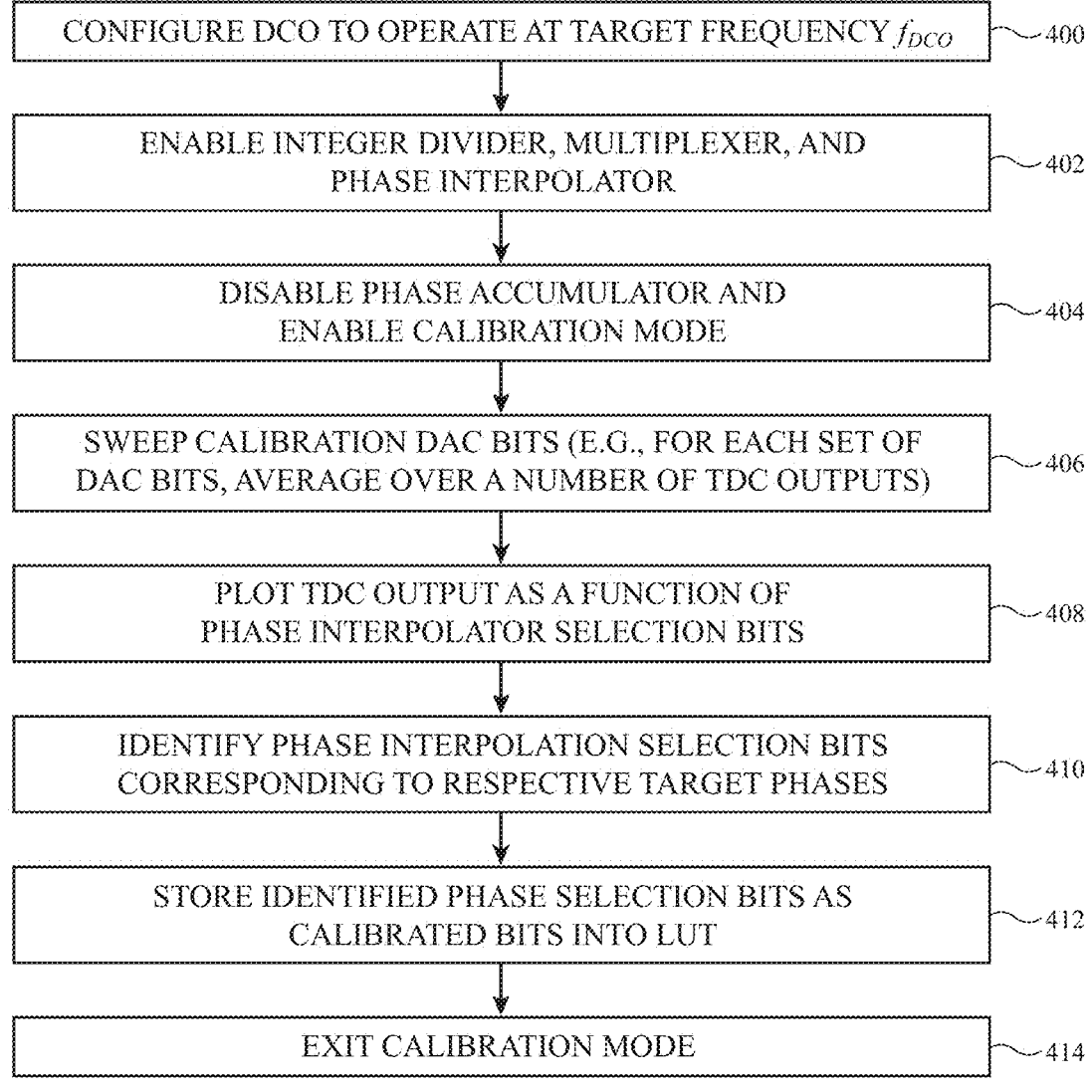

CONFIGURE DCO TO OPERATE AT TARGET FREQUENCY $f_{DCO}$ ⟶ 400

ENABLE INTEGER DIVIDER, MULTIPLEXER, AND
PHASE INTERPOLATOR ⟶ 402

DISABLE PHASE ACCUMULATOR AND
ENABLE CALIBRATION MODE ⟶ 404

SWEEP CALIBRATION DAC BITS (E.G., FOR EACH SET OF
DAC BITS, AVERAGE OVER A NUMBER OF TDC OUTPUTS) ⟶ 406

PLOT TDC OUTPUT AS A FUNCTION OF
PHASE INTERPOLATOR SELECTION BITS ⟶ 408

IDENTIFY PHASE INTERPOLATION SELECTION BITS
CORRESPONDING TO RESPECTIVE TARGET PHASES ⟶ 410

STORE IDENTIFIED PHASE SELECTION BITS AS
CALIBRATED BITS INTO LUT ⟶ 412

EXIT CALIBRATION MODE ⟶ 414

*FIG. 7*

PHASE-LOCKED LOOP (PLL) CIRCUITRY HAVING PHASE INTERPOLATORS WITH REDUCED POWER CONSUMPTION

FIELD

This disclosure relates generally to electronic circuits, including electronic circuits with phase interpolators.

BACKGROUND

Electronic circuits can include one or more phase-locked loops. A phase-locked loop (PLL) can include a time-to-digital converter (TDC), a digital loop filter, a digitally controlled oscillator (DCO), and associated frequency dividers coupled together in a loop. The frequency dividers can include a fractional divider. A fractional divider is used to divide a frequency by a non-integer value.

A fractional divider can include a phase interpolator. A phase interpolator receives two clock signals and generates one or more corresponding output signals with a phase that is finely tuned between the phases of the two received clock signals. It can be challenging to design a phase interpolator for a frequency divider. Conventional phase interpolators can take up substantial circuit area and consume a substantial amount of power.

SUMMARY

An aspect of the disclosure provides phase-locked loop (PLL) circuitry that includes a time-to-digital converter, a first frequency divider circuit of a first divider type coupled to an output of the time-to-digital converter, and a second frequency divider circuit of a second divider type, different than the first divider type, coupled between the first frequency divider circuit and an input of the time-to-digital converter and having a phase interpolator with a plurality of delay circuits forming a first digital-to-analog converter (DAC) circuit and a second digital-to-analog converter (DAC) circuit separate from the first DAC circuit. The second frequency divider can further include a multiplexing circuit configured to receive a plurality of clock signals from the first frequency divider and to output corresponding first and second clock signals selected from the plurality of clock signals, a lookup table (LUT) circuit configured to provide selection bits to a control input of the phase interpolator, a phase accumulator control circuit configured to accumulate phase increments and to output control signals to the LUT circuit and the multiplexing circuit, and an additional multiplexing circuit configured to selectively output the selection bits from the LUT circuit or calibration bits to the control input of the phase interpolator.

An aspect of the disclosure provides a method of operating phase-locked loop (PLL) circuitry, including: with an oscillator, producing an output clock signal; with a frequency divider, receiving the output clock signal and outputting a plurality of clock signals; with a multiplexer, receiving the plurality of clock signals and selectively outputting first and second clock signals from among the plurality of clock signals; with a phase interpolator, receiving the first and second clock signals and outputting a feedback clock signal; and with a time-to-digital converter, receiving the first clock signal from the multiplexer and the feedback clock signal from the phase interpolator. The method can further include: with a lookup table, providing selection bits to a control input of the phase interpolator; providing calibration bits to the phase interpolator while sampling phase data output from the time-to-digital converter; and identifying calibrated selection bits corresponding to respective target phases based on the sampled phase data and storing the calibrated selection bits in the lookup table. The lookup table can include multiple registers. The method can further include storing a first calibrated code in a first of the registers that enables the phase interpolator to provide a first phase, storing a second calibrated code in a second of the registers that enables the phase interpolator to provide a second phase greater than and separated from the first phase by a given phase difference, and storing a third calibrated code in a third of the registers that enables the phase interpolator to provide a third phase greater than and separated from the second phase by the given phase difference.

An aspect of the disclosure provides a phase interpolator circuit that includes a first input configured to receive a first clock signal, a second input configured to receive a second clock signal different than the first clock signal, and a plurality of delay cells forming a first digital-to-analog converter (DAC) circuit and a second digital-to-analog converter (DAC) circuit separate from the first DAC circuit. The first DAC circuit is controlled using a first coding scheme, whereas the second DAC circuit is controlled using a second coding scheme different than the first coding scheme. The second DAC circuit can be used to calibrate the first DAC circuit.

At least one delay cell in the plurality of delay cells can include a first pull-down transistor configured to receive the first clock signal, a second pull-down transistor coupled in series with the first pull-down transistor and configured to receive the second clock signal, a third pull-down transistor coupled in parallel with the second pull-down transistor and configured to receive a selection bit, a first pull-up transistor configured to receive the first clock signal, a second pull-up transistor coupled in series with the first pull-up transistor and configured to receive the second clock signal, a third pull-up transistor coupled in parallel with the second pull-up transistor and configured to receive an inverted version of the selection bit, a fourth pull-down transistor coupled between an output node and the first pull-down transistor and configured to receive an enable signal, a fourth pull-up transistor coupled between the output node and the first pull-up transistor and configured to receive an inverted version of the enable signal, and an inverter having an input coupled to the output node.

BRIEF DESCRIPTION OF THE DRAWINGS

FIG. 7 is a flowchart of illustrative steps for calibrating a phase interpolator in accordance with some embodiments.

DETAILED DESCRIPTION

A phase interpolator is provided that can include segmented digital-to-analog converters (DACs). The phase interpolator can be included as part of a fractional divider in a phase-locked loop (PLL). In other embodiments, phase interpolators can be included as part of high-speed serial interfaces (e.g., serial links), clock and data recovery (CDR) circuits, data skew compensation circuits, and/or other types of electronic circuits that might need to align the timing of different signals. The phase interpolator can include a first DAC that employs a thermometer coding scheme and a second DAC that employs a binary coding scheme. Each DAC can include one or more delay cells having pull-up transistors and pull-down transistors arranged in a way to optimize for smaller area, reduced gate loading, and lower power consumption. The second DAC can be used to calibrate the first DAC to achieve an overall higher interpolation resolution. A time-to-digital converter in the PLL can also be used to calibrate the phase interpolator. Phase interpolator circuitry configured and operated in this way can be technically advantageous and beneficial to provide improved interpolation accuracy with reduced power consumption and circuit area.

Figure 1:
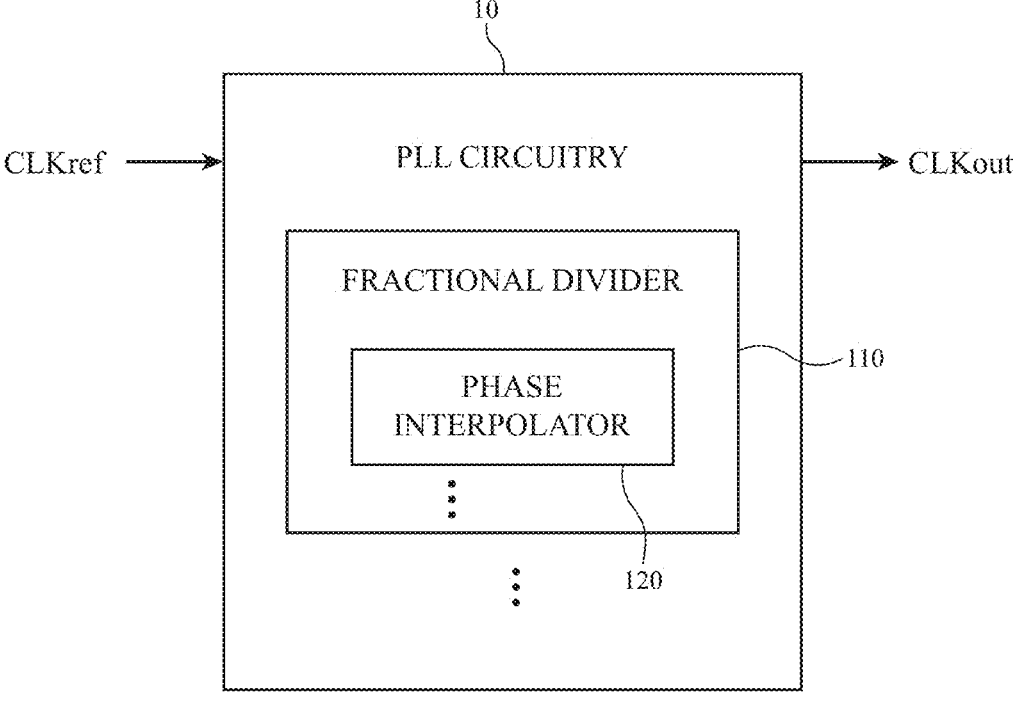
FIG. 1 is a block diagram of illustrative phase-locked loop (PLL) circuitry having a fractional divider with a phase interpolator in accordance with some embodiments.

FIG. 1 is a diagram of illustrative phase-locked loop (PLL) circuitry such as PLL circuitry 10 that can be included as part of an integrated circuit, sometimes referred to as an integrated circuit (IC) die or chip. The PLL circuitry 10 can be a circuit configured to receive a reference signal and to generate a corresponding output signal having a phase and a frequency that is synchronized based on the phase and frequency of the reference signal. The reference signal can be a reference clock signal CLKref having a reference (clock) frequency fref. The output signal can be an output clock signal CLKout having an output (clock) frequency fout. The output clock frequency fout can be equal to some multiple (e.g., an integer multiple or a non-integer multiple) of the reference clock frequency fref. To generate signal CLKout with output frequency fout equal to some non-integer multiple of fref, PLL circuitry 10 can include a fractional divider such as fractional divider 110. A "fractional" divider 110 can refer to and be defined herein as a frequency divider circuit configured to divide a periodic (clock) signal by a non-integer value (e.g., by 2.5, 3.75, 4.125, etc.). In contrast, an "integer" divider can refer to a frequency divider circuit configured to divide a clock signal by an integer value (e.g., by 2, 3, 4, etc.). Integer divider 106 and fractional divider 110 can be considered different types of frequency divider circuits.

As shown in FIG. 1, fractional divider 110 can include a phase interpolation circuit such as phase interpolator 120. Phase interpolator 120 can refer to and be defined herein as an electronic circuit configured to receive at least two input signals such as two input clock signals with different phases and to generate one or more output signals with phases that are at adjustable intermediate values between the phases of the two input signals. The example of FIG. 1 in which phase interpolator 120 is included as part of PLL circuitry 10 is illustrative. In general, phase interpolator(s) 120 can be included as part of clock and data recovery (CDR) circuitry to help align the phases of different clock signals, as part of serial/deserializer circuitry to align the timing of transmitted and received data bits (e.g., as part of a serial data link), and/or as part of other circuitry that might require fine control over the phases of high-frequency signals.

Figure 2:
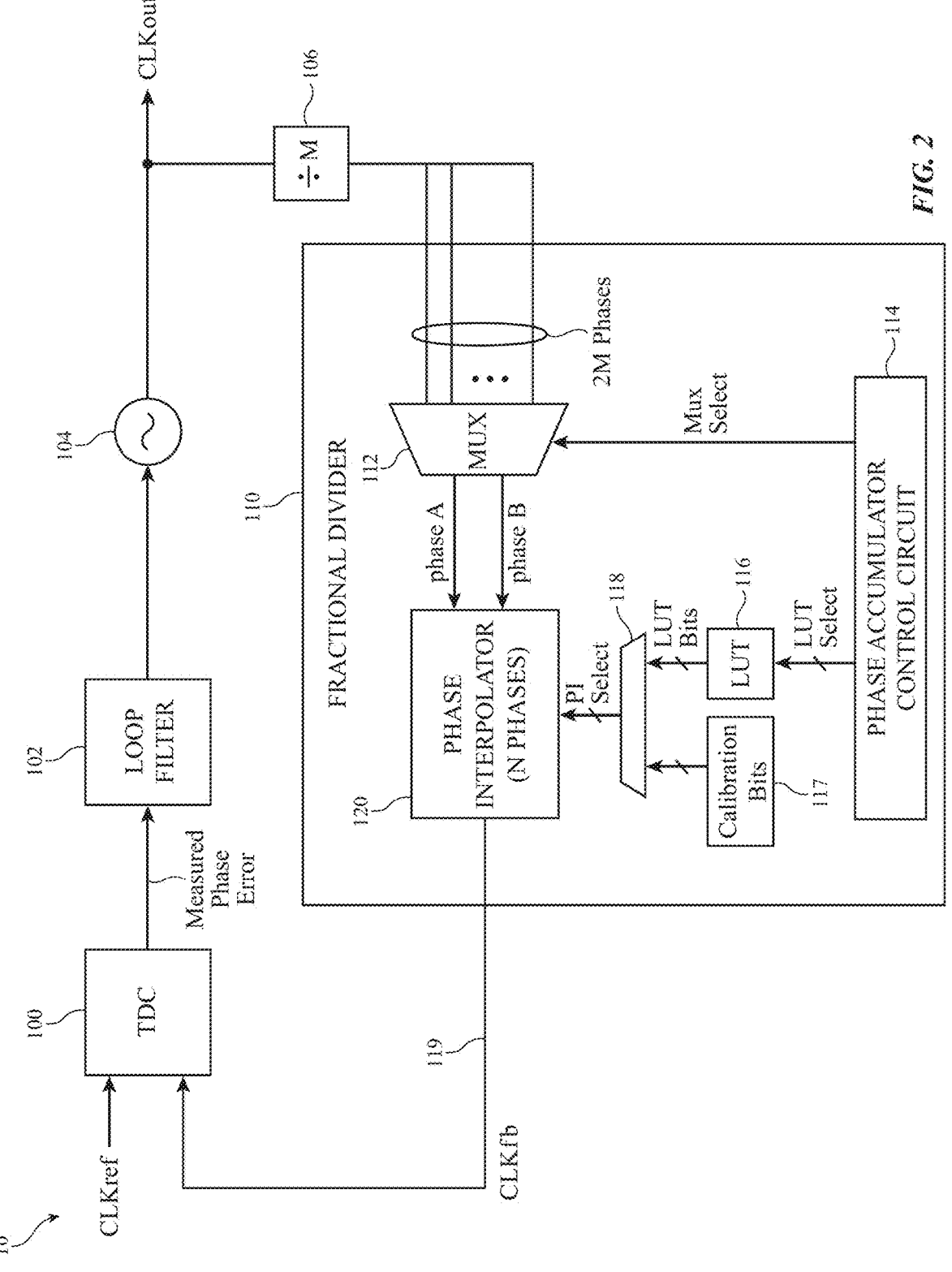
FIG. 2 shows a more detailed implementation of an illustrative fractional divider within the PLL circuitry shown in FIG. 1 in accordance with some embodiments.

FIG. 2 shows an exemplary implementation of PLL circuitry 10. As shown in FIG. 2, PLL circuitry 10 can include a time-to-digital conversion circuit such as time-to-digital converter (TDC) 100, a filter circuit such as a digital loop filter 102, an oscillator circuit such a digitally controlled oscillator (DCO) 104, and frequency division circuitry such as frequency divider 106 and frequency divider 110. Time-to-digital converter 100 may have a first input configured to receive a reference clock signal CLKref (e.g., a clock signal having reference frequency fref), a second input configured to receive a feedback clock signal CLKfb (e.g., a clock signal having feedback frequency ffb), and an output on which a digital signal that is proportional to the phase/time difference between signals CLKref and CLKfb can be generated. Time-to-digital converter 100 may, for example, generate at its output a digital code that is proportional to a time interval between rising edges of clock signals CLKref and CLKfb or between the falling edges of clock signals CLKref and CLKfb. This digital output signal (code) that is produced by time-to-digital converter 100 can be referred to as a measured phase error, phase difference, or phase offset.

The digital loop filter 102 may be coupled to the output of time-to-digital converter 100 and can be configured to output a corresponding filtered digital signal (e.g., a filtered binary code). Loop filter 102 may be coupled to digitally controlled oscillator 104. Digitally controlled oscillator 104, sometimes referred to more generically as a variable oscillator, may have an input coupled to digital loop filter 102 and an output at which output clock signal CLKout is generated. The clock frequency fout of oscillator output clock signal CLKout can be a function of the filtered digital signal received from digital loop filter 102. Various ways of implementing digitally controlled oscillator 104 can be employed.

Signal CLKout can be fed to an input of frequency divider 106. Frequency divider 106 may be an integer divider (e.g., a divider circuit configured to divide the input signal by an integer M). Integer M can have a value that is equal to 2, 3, 4, 5, 6-10, 10-50, 50-100, greater than 100, or other integer value. Integer divider 106 can be configured to receive signal CLKout, divide signal CLKout by M, and produce 2M corresponding clock signals with different phases. As an example, if M is equal to four, frequency divider 106 will divide signal CLKout by a factor of 4, thus generating 8 corresponding clock signals of different phases (e.g., eight clock signals successively offset by 45 degrees). As another example, if M is equal to two, frequency divider 106 will divide signal CLKout by a factor of 2, thus generating 4 corresponding clock signals of different phases (e.g., two clock signals successively offset by 90 degrees). As an example, if M is equal to eight, frequency divider 106 will divide signal CLKout by a factor of 8, thus generating 16 corresponding clock signals of different phases (e.g., 16 clock signals successively offset by 22.5 degrees).

The clock signals of different phases output from frequency divider 106 can be fed to frequency divider 110. Frequency divider 110 can be a fractional divider. Fractional divider 110 can refer to a frequency divider circuit configured to divide one or more clock signals by a non-integer value (e.g., by 2.5, 3.75, 4.125, 4.03125, 4.0625, 4.09375, etc.). In the example of FIG. 2, fractional divider 110 can include a first selection circuit such as first multiplexer 112, a phase interpolation circuit such as phase interpolator 120, a second selection circuit such as second multiplexer 118, a storage circuit such as lookup table (LUT) 116, and an associated control circuit such as phase accumulator control circuit 114. Multiplexer 112, sometimes referred to as a "mux," can be configured to selectively output two clock signals from among the 2M input clock signals of different phases. The two clock signals selectively output from multiplexer 112 may be referred to herein as selected (multiplexed) clock phase signals phaseA and phaseB. Multiplexer 112 may selectively pass through a subset (pair) of the 2M input clock signals of different phases based on a mux select signal output from control circuit 114.

Phase interpolator 120 can receive the selected phase signals phaseA and phaseB from the output of multiplexer 112. Phase interpolator 120 can be an N-phase interpolator. In other words, phase interpolator 120 can be configured to interpolate N intermediate phases between the clock edges of signals phaseA and phaseB. For example, N can have a value that is equal to 4, 8, 16, 32, 2-32, 32-64, 64-128, or other integer value. A selected one of the N intermediate phases generated by phase interpolator 120 can be output as feedback clock signal CLKfb to the second input of TDC 100, as shown by feedback path 119.

In accordance with some embodiments, phase interpolator 120 can include a plurality of delay cells, sometimes referred to delay circuits, with adjustable drive strengths (e.g., to provide a tunable amount of delay). The delay circuits can be individually adjusted to tune the timing of the N interpolated signals produced by phase interpolator 120. The delay circuits can be adjusted based on phase interpolator selection bits output from multiplexer 118. Multiplexer 118 can have a first input configured to receive stored bits from LUT 116 and a second input configured to receive calibration bits. During calibration, multiplexer 118 can be configured to pass the calibration bits as phase interpolator selection bits to a control input of phase interpolator 120. During normal (non-calibration) operations, multiplexer 118 can be configured to pass a selected subset of the stored LUT bits as phase interpolator selection bits to the control input of phase interpolator 120.

Lookup table 116 can be controlled by phase accumulator control circuit 114. Phase accumulator control circuit 114 may output LUT select bits to LUT 116, which direct LUT 116 to output a selected portion of bits stored on LUT 116. Phase accumulator control circuit 114 can be implemented as a finite state machine (FSM), as an example. Phase accumulator control circuit 114 can be configured to accumulate phase increments over time, where the increments represent a fractional part of the division ratio, allowing fractional divider 110 to produce a precise average output frequency that is a non-integer multiple of the reference frequency fref. Phase accumulator 114 can continuously add phase increments to a running cumulative (total) phase. When the total phase reaches or exceeds a full cycle (e.g., 360 degrees or the maximum value of the accumulator's resolution), phase accumulator 114 can reset or wrap around (e.g., by creating a phase carry-over) to ensure that the accumulated phase stays within a defined range. Control circuit 114 is thus sometimes also referred to as a phase accumulator and "wrapper" subsystem.

The implementation of fractional divider 110 shown in FIG. 2 is illustrative. In general, fractional divider 110 can include one or more phase interpolators coupled to the PLL components in other suitable arrangements.

Figures 3, 4:
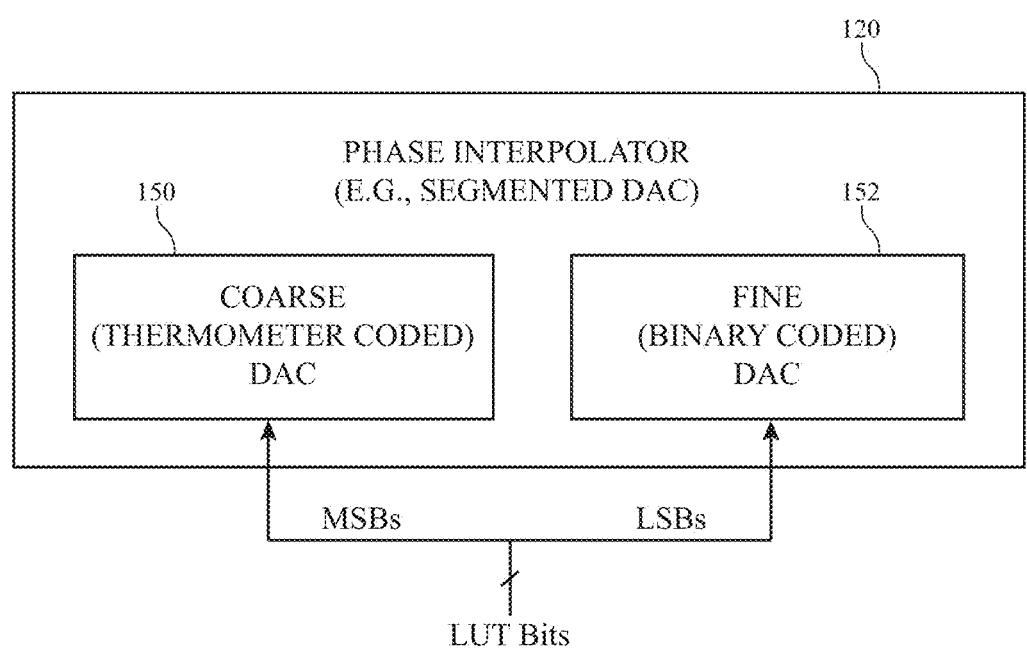
FIG. 3 is a diagram of an illustrative phase interpolator having segmented digital-to-analog converters (DACs) in accordance with some embodiments.
FIG. 4 is a diagram of an illustrative phase interpolator configured to share a supply current with a replica phase interpolator in accordance with some embodiments.

In accordance with some embodiments not mutually exclusive with the embodiments described in connection with FIGS. 1 and 2, phase interpolator 120 can include a first digital-to-analog converter (DAC) portion such as first DAC circuit 150 and a second digital-to-analog (DAC) portion such as second DAC circuit 152. The two DAC circuits 150 and 152 can be controlled using different digital control schemes. In the example of FIG. 3, first DAC circuit 150 can be controlled using a thermometer coding scheme, whereas second DAC circuit 152 can be controlled using a binary coding scheme. "Thermometer" coding may refer to a coding scheme in which a number is represented by a sequence of bits where all (leading) bits up to a certain point are set equal to '1' and the rest are '0'. For example, a value of 4 can be represented by a 5-bit thermometer code as '11110', whereas a value of 2 can be represented by a 5-bit thermometer code as '11000'. In contrast, a value of 1 is represented by a 3-bit binary code as '001', whereas a value of 3 is represented by a 3-bit binary code as '011'.

First DAC circuit 150 can be configured to provide a coarse phase spacing (e.g., to provide phase delays of a first step size), whereas second DAC circuit 152 can be configured to provide a fine phase spacing (e.g., to provide phase delays of a second step size less than the first step size). The second (fine) step size provided by the second DAC 152 can be less than half, less than a quarter, less than 1/5, less than 10%, less than 5%, less than 2%, or less than 1% of the first (coarse) step size provided by the first DAC 150. Configured as such, the first DAC circuit 150 can be referred to herein as a "coarse" DAC, whereas the second DAC circuit 152 can be referred to herein as a "fine" DAC. As described in connection with FIG. 2, phase interpolator 120 can be controlled by phase interpolator selection bits, which can be the LUT bits output from LUT 116. A first portion of the LUT bits (e.g., the most significant bits or MSBs) can be used to control the coarse DAC portion 150, whereas a second portion of the LUT bits (e.g., the least significant bits or LSBs) can be used to control the fine DAC portion 152. Phase interpolator 120 configured in this way is sometimes referred to as having "segmented" DAC circuits.

In accordance with some embodiments not mutually exclusive with the embodiments described in connection with FIGS. 1-3, phase interpolator 120 can be coupled to a replica phase interpolator 120'. Replica phase interpolator 120' may have identical circuit structure, device sizing, and transistor layout as phase interpolator 120. Phase interpolator 120 and replica phase interpolator 120' may be coupled to a common positive power supply line 160 (e.g., a positive power supply terminal on which positive power supply voltage Vdd is provided). Arranged in this way, power supply line 160 can provide a power supply current Isupp that is shared between phase interpolator 120 and replica phase interpolator 120' (e.g., replica phase interpolator 120' can receive at least a portion of Isupp). As described above in connection with FIGS. 2 and 3, phase interpolator 120 can be controlled using a first set of phase interpolator selection bits (e.g., using stored LUT bits).

In accordance with an embodiment, the replica phase interpolator 120' can be controlled using a second set of phase interpolator selection bits that are different than the first set of phase interpolator selection bits. The second set of phase interpolator selection bits can be complimentary to the first set of phase interpolator selection bits. As an example, the second set of phase interpolator selection bits can be an inverted version of the first set of phase interpolator selection bits (e.g., where the '1' bits are substituted with '0' bits, and vice versa). This is illustrative. If desired, other ways of modifying the first interpolator selection bits to obtain the second set of interpolator selection bits can be employed. Operating phase interpolator 120 and replica phase interpolator 120' in this way can be technically advantageous and beneficial to balance the supply current Isupp drawn from power supply line 160 due to different codes.

Figure 5:
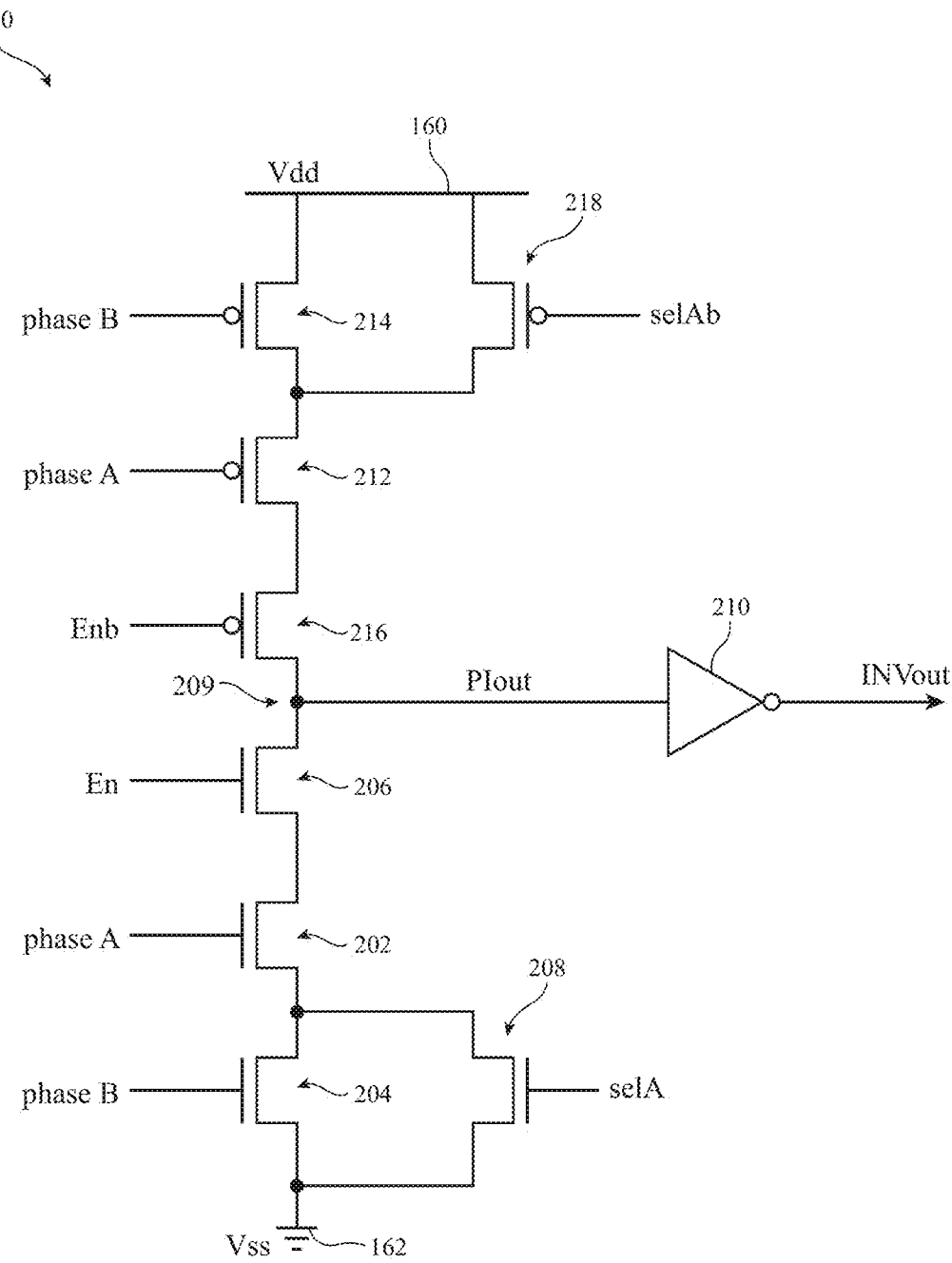
FIG. 5 is a circuit diagram of an illustrative delay circuit that can be included within a phase interpolator of the type shown in FIGS. 1-4 in accordance with some embodiments.

In accordance with some embodiments, phase interpolator 120 of the type described in connection FIGS. 1-4 can include a plurality of delay cells such as delay circuit 200 of FIG. 5. Each delay circuit 200 within phase interpolator 120 can be individually adjusted to control its delay and thus tune the phase interpolation of phase interpolator 120. Delay circuit 200 can be referred to as a phase interpolator delay circuit (cell). As shown in FIG. 5, delay circuit 200 can include pull-down transistors 202, 204, 206, and 208 and pull-up transistors 212, 214, 216, and 218. The pull-down transistors 202, 204, 206, and 208 can be n-type transistors such as n-channel metal-oxide-semiconductor (NMOS) transistors. Transistors 206, 202, and 204 can be coupled in series between output node 209 and a ground power supply line 162 (e.g., a ground power supply terminal on which ground voltage Vss is provided). In particular, transistor 206 can have a drain terminal coupled to output node 209, a gate terminal configured to receive an enable signal En, and a source terminal coupled to transistor 202. The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal).

The term "activate" with respect to a switch (or transistor) may refer to or be defined herein as an action that places the switch in an "on" or low-impedance state such that the two terminals of the switch are electrically connected to conduct current. Activating a switch can sometimes be referred to as turning on or closing a switch. The term "deactivate" with respect to a switch (or transistor) may refer to or be defined herein as an action that places the switch in an "off" or high-impedance state such that the two terminals of the switch/transistor are electrically disconnected with minimal leakage current. Deactivating a switch can sometimes be referred to as turning off or opening a switch.

Signal En can be asserted (e.g., driven high) to selectively enable phase interpolator delay circuit 200 and can be deasserted (e.g., driven low) to selectively disable delay circuit 200. Transistor 206 configured to receive signal En can be referred to as an enable transistor. The use of enable transistor 206 can be technically advantageous and beneficial to reduce transient effects associated with clock signals controlling the other pull-down transistors 202, 204, and 208 from being coupled to output node 209. The use of enable transistor 206 is optional and can be omitted, if desired to minimize area.

Pull-down transistor 202 can have a drain terminal coupled to transistor 206, a gate terminal configured to receive clock signal phaseA (see, e.g., a first clock phase output from multiplexer 112), and a source terminal coupled to transistor 204. Pull-down transistor 204 can have a drain terminal coupled to transistor 202, a gate terminal configured to receive clock signal phaseB (see, e.g., a second clock phase output from multiplexer 112), and a source terminal coupled to ground line 162. Pull-down transistor 208 can have a drain terminal coupled to transistor 202, a gate terminal configured to receive selection signal selA (see, e.g., one of the phase interpolator selection bits output from multiplexer 118), and a source terminal coupled to ground line 162. Arranged in this way, transistor 208 can be considered to be coupled "in parallel" with transistor 204. Transistor 208 can be activated by driving high signal selA to increase the drive strength of delay circuit 200 (e.g., to increase the pull-down drive strength and thus reduce the delay provided by cell 200) and can be deactivated by driving low signal selA to reduce the drive strength of delay circuit 200 (e.g., to reduce the pull-down drive strength and thus increase the delay provided by cell 200).

At the other end, the pull-up transistors 212, 214, 216, and 218 can be p-type transistors such as p-channel metal-oxide-semiconductor (PMOS) transistors. Transistors 216, 212, and 214 can be coupled in series between output node 209 and positive power supply line 160. In particular, transistor 216 can have a drain terminal coupled to output node 209, a gate terminal configured to receive another enable signal Enb, and a source terminal coupled to transistor 212. Signal Enb can be an inverted version of signal En. Signal Enb can be asserted (e.g., driven low) to selectively enable phase interpolator delay circuit 200 and can be deasserted (e.g., driven high) to selectively disable delay circuit 200. Transistor 216 configured to receive enable signal Enb can also be referred to as an enable transistor. The use of enable transistor 216 can be technically advantageous and beneficial to reduce transient effects associated with clock signals controlling the other pull-up transistors 212, 214, and 218 from being coupled to output node 209. The use of enable transistor 216 is optional and can be omitted, if desired to minimize area.

Pull-up transistor 212 can have a drain terminal coupled to transistor 216, a gate terminal configured to receive clock signal phaseA (see, e.g., the first clock phase output from multiplexer 112), and a source terminal coupled to transistor 214. Pull-up transistor 214 can have a drain terminal coupled to transistor 212, a gate terminal configured to receive clock signal phaseB (see, e.g., the second clock phase output from multiplexer 112), and a source terminal coupled to power supply line 160. Pull-up transistor 218 can have a drain terminal coupled to transistor 212, a gate terminal configured to receive an inverted version of the selection bit (e.g., signal selAb), and a source terminal coupled to power supply line 160. Arranged in this way, transistor 218 can be considered to be coupled "in parallel" with transistor 214. Transistor 218 can be activated by driving low signal selAb (e.g., by driving high bit selA) to increase the drive strength of delay circuit 200 (e.g., to increase the pull-up drive strength and thus reduce the delay provided by cell 200) and can be deactivated by driving high signal selAb to reduce the drive strength of delay circuit 200 (e.g., to reduce the pull-up drive strength and thus increase the delay provided by cell 200).

An output signal PIout can be produced at output node 209. Output node 209 can be coupled to an input of inverter 210. Inverter 210 can optionally be considered part of the delay circuit 200. Inverter 210 can generate a corresponding output INVout that is inverted with respect to signal PIout. Phase interpolator delay circuit 200 configured in this way can be technically advantageous and beneficial for minimizing circuit area, reducing gate loading, and minimizing switching current and power consumption. The example of FIG. 5 in which the transistors of delay cell 200 are implemented as MOS transistors is exemplary. In general, delay cell 200 can be implemented using metal-oxide-semiconductor field-effect transistors (MOSFETs), bipolar junction transistors (BJTs), insulated-gate bipolar transistors (IGBTs), junction field-effect transistors (JFETs), tunnel field-effect transistors (TFETs), fin field-effect transistors (FinFETs), silicon-on-insulator (SOI) transistors, carbon nanotube transistors, nanowire transistors, a combination of these transistors, and/or other types of transistors.

Figure 6:
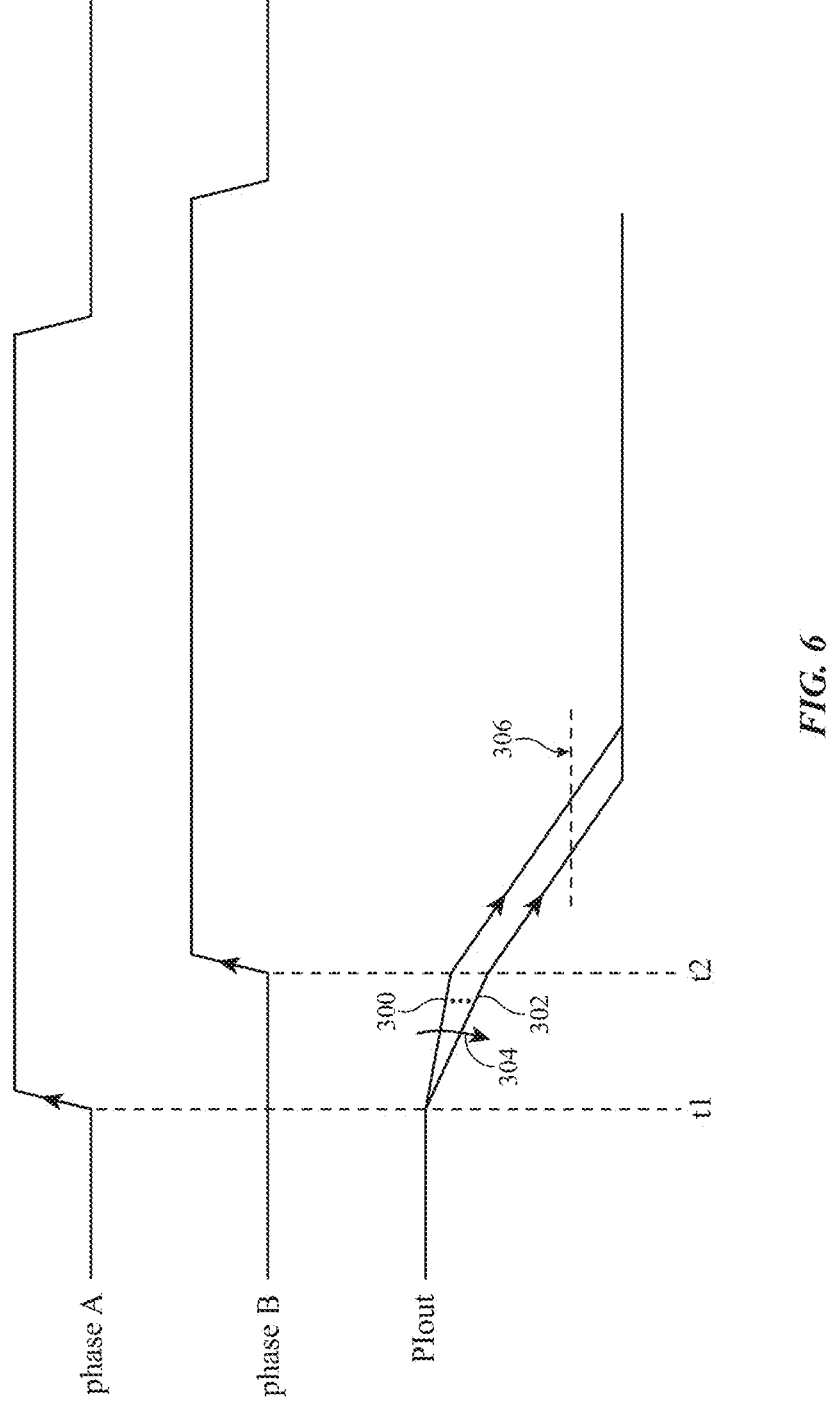
FIG. 6 is a timing diagram illustrating an operation of a phase interpolator of the type shown in FIGS. 1-4 in accordance with some embodiments.

FIG. 6 is a timing diagram illustrating the operation of phase interpolator 120 of the type described in connection with FIGS. 1-4. In particular, FIG. 6 shows clock signals phaseA and phaseB that can be received at inputs of phase interpolator 120 from multiplexer 112 (see FIG. 2). Clock signal phaseA may have a clock edge (e.g., a rising edge) at time t1, whereas clock signal phaseB may have a clock edge (e.g., a rising edge) at time t2. In other words, clock signal phaseB may be delayed with respect to clock signal phaseA. At time t1, a number of delay cells (e.g., delay circuits 200 of the type described in connection with FIG. 5) may be selectively activated based on the phase interpolation selection bits.

In the example of FIG. 6, waveform 300 shows how phase interpolator output signal PIout (see, e.g., the voltage at output node 209 in FIG. 5) begins to discharge at a first rate after time t1—this corresponds to a first scenario in which a first number of delay cells 200 is activated. Waveform 302 shows how phase interpolator output signal PIout begins to discharge at a second rate greater than the first rate after time t1—this can correspond to a second scenario in which a second number of delay cells, greater than the first number of delay cells, is activated. Since the second number of delay cells being activated in the second scenario is greater than the first number of delay cells, the discharge rate (slope) of waveform 302 will be greater than that of waveform 300. The rate of discharge can be tuned to other levels, as indicated by arrow 304. In any case, at time t2, all of the delay cells 200 will be activated by the rising edge of signal phaseB. Thus, at time t2, waveforms 300 and 302 (and any other PIout waveforms) will all discharge at the same maximum rate until signal PIout crosses the inverter trip point (threshold) 306. When signal PIout falls below the inverter threshold level 306, the corresponding output inverter 210 (see FIG. 5) will drive signal INVout high. A number of interpolated clock signals can be generated in this way. In the example of FIG. 2, phase interpolator 120 can be configured to output N interpolated phase signals.

Phase interpolator 120 can optionally be calibrated in accordance with a phase interpolator calibration scheme. For phase interpolator 120 implemented using segmented DACs as shown and described in connection with FIG. 3, the fine (LSB) DAC 152 can be used to calibrate the coarse (MSB) DAC 150 to achieve high phase resolution. For phase interpolator 120 that is coupled within a phase-locked loop as shown in the example of FIG. 2, the TDC 100 embedded within the PLL circuitry 10 can be used for calibration. During normal operation, the first (1) input of TDC 100 can be configured to receive reference clock signal CLKref, whereas the second (2) input of TDC 100 can be configured to receive feedback clock signal CLKfb from the output of phase interpolator 120 via path 119, as shown in the arrangement of FIG. 2.

During calibration operations, however, the first (1) input of TDC 100 can be configured to receive clock signal phaseA from the output of multiplexer 112 instead of receiving CLKref while the second (2) input of TDC 100 can continue to receive a feedback clock signal CLKfb from the output of phase interpolator 120. During calibration, multiplexer 118 can be configured to pass through calibration bits to phase interpolator 120 while ignoring (bypassing) the stored bits from LUT 116. The calibration bits can be provided by a counter circuit such as counter 117. Counter 117 can be used to provide count values as calibration bits (e.g., to ramp the phase interpolator selection bits) during calibration. Alternatively, a single register within LUT 116 storing calibration bits can be swept during calibration while remaining registers within LUT 116 remain idle. LUT 116 can, for example, include a plurality of registers for storing sets of LUT bits that can be selectively conveyed to phase interpolator 120 based on the LUT selection bits output from control circuit 114. In such scenarios, multiplexer 118 can optionally be omitted.

FIG. 7 is a flowchart of illustrative steps for calibrating phase interpolator 120. During the operations of block 400, digitally controlled oscillator 104 can be configured to operate at a target output frequency $f_{DCO}$. In other words, DCO 104 can be configured to generate an output clock signal CLKout toggling at target frequency $f_{DCO}$.

During the operations of block 402, the integer frequency divider 106, multiplexer 112, and phase interpolator 120 can be enabled (activated). For example, the divide-by-M integer divider 106 in the example of FIG. 2 can be configured to output 2M corresponding clock phase signals based on the output clock signal CLKout toggling at frequency $f_{DCO}$. Multiplexer 112 can selectively pass through two of these 2M clock phase signals as clock signals phaseA and phaseB to the inputs of phase interpolator 120. Phase interpolator 120 can then generate N interpolated phases based on signals phaseA and phaseB.

During the operations of block 404, the phase accumulator control circuit 114 can be individually disabled (deactivated) and a calibration mode can be enabled. In the example of FIG. 2, multiplexer 118 can be configured to pass through the calibration bits to phase interpolator 120 while ignoring (bypassing) the stored bits from LUT 116. Counter circuit 117 can be used to provide count values as calibration bits (e.g., to ramp the phase interpolator selection bits) during calibration. Alternatively, a single register within LUT 116 storing the calibration bits can be used to pass the calibration bits to phase interpolator 120. In such scenarios, control circuit 114 can be used to overwrite the calibration bits stored in the single register.

During the operations of block 406, the calibration bits can be swept from a minimum value to a maximum value, or vice versa. Since the calibration bits can be conveyed to the corresponding segmented DACs within phase interpolator 120, the calibration bits are sometimes referred to as calibration "DAC" bits. For each set of calibration DAC bits being provided as phase interpolator selection bits to the control input of phase interpolator 120, the measured phase error output by TDC 100 can be sampled and averaged over a number of TDC outputs (e.g., averaged over a number of data samples).

Figure 8:
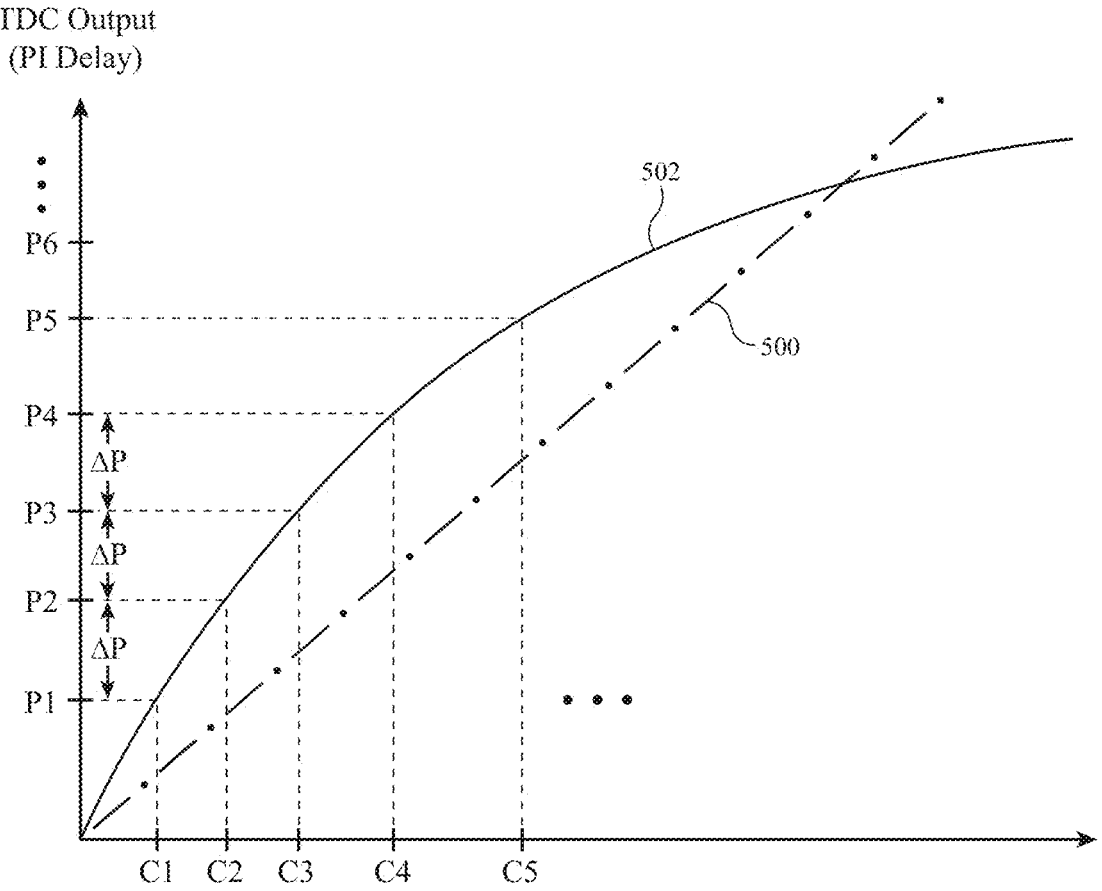
FIG. 8 is a diagram showing illustrative phase interpolator selection codes obtained via calibration that can be stored within a lookup table in accordance with some embodiments.

During the operations of block 408, the averaged TDC output values obtained from the sweep can be plotted as a function of the different sets of calibration DAC bits, sometimes referred to as calibration phase interpolator selection bits. FIG. 8 is a diagram plotting the TDC output (measured) values as a function of the phase interpolation selection bits obtained via calibration. In FIG. 8, dotted line 500 represents an ideal (linear) relationship between the TDC output values and the phase interpolator selection bits. In practice, however, the relationship between the TDC output values and the phase interpolator selection bits can be non-linear. For example, curve 502 may represent a measured (empirical) relationship between the (averaged) TDC output values and the calibration phase interpolator selection bits. As shown in FIG. 8, curve 502 may deviate from the ideal relationship of line 500.

The TDC 100 effectively measures the phase delay (error) between signal phaseA and the current signal CLKfb output from phase interpolator 120. During the operations of block 410, calibrated phase interpolation selection bits can be identified corresponding to the respective target phases P1, P2, P3, . . . PN for the N interpolated phases of phase interpolator 120. For example, a first calibrated phase interpolator code C1 can be identified for producing a corresponding phase P1, a second calibrated phase interpolator code C2 can be identified for producing a corresponding phase P2 that is greater than P1 by interpolation interval ΔP, a third calibrated phase interpolator code C3 can be identified for producing a corresponding phase P3 that is greater than P2 by interpolation interval ΔP, etc.

During the operations of block 412, the identified calibrated phase interpolator codes (e.g., C1, C2, C3, C4, C5, etc.) can be stored within the various registers of LUT 116. For example, calibrated code (bits) C1 can be stored within a first register of LUT 116, calibrated code (bits) C2 can be stored within a second register of LUT 116, calibrated code (bits) C3 can be stored within a third register of LUT 116, calibrated code (bits) C4 can be stored within a fourth register of LUT 116, and so on. Calibration operations can then be terminated at block 414. Configured in this way, LUT 116 is able to control phase interpolator 120 to output N equally spaced interpolated clock signals during normal operation of fractional divider 110.

The operations of FIG. 7 are illustrative. In some embodiments, one or more of the described operations may be modified, replaced, or omitted. In some embodiments, one or more of the described operations may be performed in parallel. In some embodiments, additional processes may be added or inserted between the described operations. If desired, the order of certain operations may be reversed or altered and/or the timing of the described operations may be adjusted so that they occur at slightly different times. In some embodiments, the described operations may be distributed in a larger system.

The foregoing is illustrative and various modifications can be made to the described embodiments. The foregoing embodiments may be implemented individually or in any combination.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. Phase-locked loop circuitry comprising:
a time-to-digital converter;
a first frequency divider circuit of a first divider type coupled to an output of the time-to-digital converter; and
a second frequency divider circuit of a second divider type, different than the first divider type, coupled between the first frequency divider circuit and an input of the time-to-digital converter and having a phase interpolator with a plurality of delay circuits forming a first digital-to-analog converter (DAC) circuit and a second digital-to-analog converter (DAC) circuit separate from the first DAC circuit.

2. The phase-locked loop circuitry of claim 1, further comprising:

a digital loop filter coupled to the output of the time-to-digital converter; and
a digitally controlled oscillator coupled between the digital loop filter and the first frequency divider circuit.

3. The phase-locked loop circuitry of claim 1, wherein:
the first frequency divider circuit of the first divider type comprises an integer frequency divider; and
the second frequency divider circuit of the second divider type comprises a fractional frequency divider.

4. The phase-locked loop circuitry of claim 1, wherein the second frequency divider circuit further comprises:
a multiplexing circuit configured to receive a plurality of clock signals from the first frequency divider and to output corresponding first and second clock signals selected from the plurality of clock signals.

5. The phase-locked loop circuitry of claim 4, wherein at least one delay circuit in the plurality of delay circuits comprises:
a first pull-down transistor configured to receive the first clock signal;
a second pull-down transistor coupled in series with the first pull-down transistor and configured to receive the second clock signal; and
a third pull-down transistor coupled in parallel with the second pull-down transistor and configured to receive a selection bit.

6. The phase-locked loop circuitry of claim 5, wherein the at least one delay circuit in the plurality of delay circuits further comprises:
a first pull-up transistor configured to receive the first clock signal;
a second pull-up transistor coupled in series with the first pull-up transistor and configured to receive the second clock signal; and
a third pull-up transistor coupled in parallel with the second pull-up transistor and configured to receive an inverted version of the selection bit.

7. The phase-locked loop circuitry of claim 6, wherein the at least one delay circuit in the plurality of delay circuits further comprises:
a fourth pull-down transistor coupled between an output node and the first pull-down transistor and configured to receive an enable signal;
a fourth pull-up transistor coupled between the output node and the first pull-up transistor and configured to receive an inverted version of the enable signal; and
an inverter having an input coupled to the output node.

8. The phase-locked loop circuitry of claim 4, wherein the second frequency divider circuit further comprises:
a lookup table (LUT) circuit configured to provide selection bits to a control input of the phase interpolator; and
a phase accumulator control circuit configured to accumulate phase increments and to output control signals to the LUT circuit and the multiplexing circuit.

9. The phase-locked loop circuitry of claim 8, wherein the second frequency divider circuit further comprises:
an additional multiplexing circuit configured to selectively output the selection bits from the LUT circuit or calibration bits to the control input of the phase interpolator.

10. The phase-locked loop circuitry of claim 1, wherein the second frequency divider circuit further comprises:
a power supply line configured to provide a supply current to the phase interpolator; and
a replica phase interpolator configured to receive at least a portion of the supply current from the power supply line and controlled by a first set of bits, wherein the phase interpolator is controlled by a second set of bits different than the first set of bits.

11. A method of operating phase-locked loop circuitry, comprising:
with an oscillator, producing an output clock signal;
with a frequency divider, receiving the output clock signal and outputting a plurality of clock signals;
with a multiplexer, receiving the plurality of clock signals and selectively outputting first and second clock signals from among the plurality of clock signals;
with a phase interpolator, receiving the first and second clock signals and outputting a feedback clock signal; and
with a time-to-digital converter, receiving the first clock signal from the multiplexer and the feedback clock signal from the phase interpolator.

12. The method of claim 11, further comprising:
with a lookup table, providing selection bits to a control input of the phase interpolator.

13. The method of claim 12, further comprising:
with an additional multiplexer, selectively output either the selection bits from the lookup table or calibration bits from a counter to the control input of the phase interpolation; and
sweeping the calibration bits while sampling phase errors output from the time-to-digital converter.

14. The method of claim 12, wherein the lookup table comprises a plurality of registers, the method further comprising:
overwriting a selected one of the plurality of registers with calibration bits; and
sweeping the calibration bits being written to the selected one of the plurality of registers while sampling phase errors output from the time-to-digital converter.

15. The method of claim 12, further comprising:
providing calibration bits to the phase interpolator while sampling phase data output from the time-to-digital converter; and
identifying calibrated selection bits corresponding to respective target phases based on the sampled phase data and storing the calibrated selection bits in the lookup table.

16. The method of claim 12, wherein the lookup table comprises a plurality of registers, the method further comprising:
storing a first calibrated code in a first register in the plurality of registers that enables the phase interpolator to provide a first phase;

14 storing a second calibrated code in a second register in the plurality of registers that enables the phase interpolator to provide a second phase greater than and separated from the first phase by a given phase difference; and
storing a third calibrated code in a third register in the plurality of registers that enables the phase interpolator to provide a third phase greater than and separated from the second phase by the given phase difference.

17. Phase-locked loop circuitry comprising:
a time-to-digital converter;
a first frequency divider circuit coupled to an output of the time-to-digital converter; and
a second frequency divider circuit coupled between the first frequency divider circuit and an input of the time-to-digital converter and having a phase interpolator that includes a plurality of delay circuits forming a first digital-to-analog converter (DAC) circuit and a second digital-to-analog converter (DAC) circuit.

18. The phase-locked loop circuitry of claim 17, wherein:
the first DAC circuit is controlled using a first coding scheme; and
the second DAC circuit is controlled using a second coding scheme different than the first coding scheme.

19. The phase-locked loop circuitry of claim 18, wherein the first coding scheme comprises a thermometer coding scheme, wherein the second coding scheme comprises a binary coding scheme, and wherein the second DAC circuit is configured to calibrate the first DAC circuit.

20. The phase interpolator of claim 17, wherein at least one delay cell in the plurality of delay cells comprises:
a first pull-down transistor configured to receive the first clock signal;
a second pull-down transistor coupled in series with the first pull-down transistor and configured to receive the second clock signal;
a third pull-down transistor coupled in parallel with the second pull-down transistor and configured to receive a selection bit;
a first pull-up transistor configured to receive the first clock signal;
a second pull-up transistor coupled in series with the first pull-up transistor and configured to receive the second clock signal; and
a third pull-up transistor coupled in parallel with the second pull-up transistor and configured to receive an inverted version of the selection bit.

* * * * *